(12) United States Patent
Alvamani et al.

(10) Patent No.: US 7,555,688 B2
(45) Date of Patent: Jun. 30, 2009

(54) METHOD FOR IMPLEMENTING TEST GENERATION FOR SYSTEMATIC SCAN RECONFIGURATION IN AN INTEGRATED CIRCUIT

(75) Inventors: Ahmad A. Alvamani, Santa Clara, CA (US); Narendra Devta-Prasanna, Bangalore (IN); Arun Gunda, San Jose, CA (US)

(73) Assignee: LSI Logic Corporation, Milpitas, CA (US)

( * ) Notice: Subject to any disclaimer, the term of this patent is extended or adjusted under 35 U.S.C. 154(b) by 552 days.

(21) Appl. No.: 11/114,583

(22) Filed: Apr. 26, 2005

(65) Prior Publication Data

US 2006/0242515 A1    Oct. 26, 2006

(51) Int. Cl.
*G01R 31/28* (2006.01)

(52) U.S. Cl. .................. 714/729; 714/726

(58) Field of Classification Search ........... 714/726, 714/727, 729
See application file for complete search history.

(56) References Cited

U.S. PATENT DOCUMENTS

| | | | | |
|---|---|---|---|---|
| 5,414,716 | A * | 5/1995 | Bershteyn | 714/738 |
| 6,041,429 | A | 3/2000 | Koenemann | 714/738 |
| 7,093,175 | B2 * | 8/2006 | Rajski et al. | 714/728 |
| 7,143,324 | B2 * | 11/2006 | Bratt et al. | 714/726 |
| 7,178,078 | B2 * | 2/2007 | Hiraide et al. | 714/739 |
| 7,237,162 | B1 * | 6/2007 | Wohl et al. | 714/726 |
| 2004/0153978 | A1 | 8/2004 | Xiang et al. | 716/3 |
| 2005/0240887 | A1 * | 10/2005 | Rajski et al. | 716/4 |
| 2006/0020862 | A1 * | 1/2006 | Kang et al. | 714/726 |

OTHER PUBLICATIONS

"LFSR-Coded Test patterns for Scan Designs," by Dr. Bernd Konemann; c/o IBM Corp., B56/901, P.O. Box 390, Poughkeepsie, NY 12533; European Test Conference (ETC'91); pp. 237-242; 1991.
"Seed Encoding with LFSRs and Cellular Automata," by Ahmad A. Al-Yamani and Edward J. McCluskey; Center for Reliable Computing, Stanford University, Stanford, CA; 40th Design Automation Conference (DAC 2003); pp. 560-565; Jun. 2-6, 2003, Anaheim, CA; © 2003.
"CircularScan: A Scan Architecture for Test Cost Reduction," by Baris Arslan and Alex Orailoglu; Computer Science and Engineering Department, University of California, San Diego, La Jolla, CA 92093; Design, Automation and Test in Europe Conference and Exhibition (Date '04), vol. 2, pp. 1290-1295 (6 pages), Feb. 2004; © 2004.
"Broadcasting Test Patterns of Multiple Circuits," by Kuen-Jong Lee, Jih-Jeen Chen, and Cheng-Hua Huang; IEEE Transactions on Computer-Aided Design (TCAD) of Integrated Circuits and Systems, vol. 18, No. 12, pp. 1793-1802; Dec. 1999; © 1999.

(Continued)

*Primary Examiner*—James C Kerveros
(74) *Attorney, Agent, or Firm*—Suiter Swantz pc llo

(57) ABSTRACT

A method for implementing test generation for systematic scan reconfiguration in an integrated circuit is presented. The method may comprise: defining at least one set of detectable faults; setting an SAS decoder configuration, the SAS decoder configuration including a don't-care bit; generating an ATPG pattern; and applying the ATPG pattern to one or more scan chain segments having a segment address associated with the SAS decoder configuration.

16 Claims, 9 Drawing Sheets

OTHER PUBLICATIONS

"Reducing Test Application Time for Full Scan Embedded Cores," by Ilker Hamzaoglu and Janak H. Patel; Center for Reliable & High-Performance Computing, University of Illinois, Urbana, IL 61801; IEEE International Symposium on Fault Tolerant Computing (FTC '99), pp. 260-267 (8 pages), 1999.

"BIST-Aided Scan Test—A New Method for Test Cost Reduction," by Takahisa Hiraide, Kwame Osei Boateng, Hideaki Konishi, Koichi Itaya, Michiaki Emori, Hitoshi Yamanaka, Takashi Mochiyama; Fujitsu Laboratories Ltd.; IEEE VLSI Test Symposium (VTS '03), pp. 359-364 (6 pages), Apr. 2003, © 2003.

"A Token Scan Architecture for Low Power Testing," by Tsung-Chu Huang and Kuen-Jong Lee; Department of Electrical Engineering, National Cheng Kung University, Tainan, Taiwan 70101, R.O.C.; International Test Conference (ITC '01); pp. 660-669; Oct. 2001; © 2001.

"Test Data Compression," by Edward J. McCluskey, Dwayne Burek, Bernd Koenemann, Subhasish Mitra, Janak Patel, Janusz Rajski, and John Waicukauski; ITC 2002 Roundtable; Design & Test of Computers, vol. 20, No. 2, pp. 76-87, Mar.-Apr. 2003; © 2003.

"Embedded Deterministic Test," by Janusz Rajski, Jerzy Tyszer, Mark Kassab, and Nilanjan Mukherjee; IEEE Transactions on Computer-Aided Design (TCAD) of Integrated Circuits and Systems, vol. 23, No. 5, pp. 776-792, May 2004; © 2004.

"Scan Architecture with Mutually Exclusive Scan Segment Activation for Shift- and Capture-Power Reduction," by Paul Rosinger, Bashir M. Al-Hashimi, and Nicola Nicolici; IEEE Transactions on Computer-Aided Design (TCAD) of Integrated Circuits and Systems, vol. 23, No. 7, pp. 1142-1153, Jul. 2004, © 2004.

"A Reconfigurable Shared Scan-in Architecture," by Samitha Samaranayake, Emil Gizdarski, Nodari Sitchinava, Frederic Neuveux, Rohit Kapur, and T.W. Williams; VLSI Test Symposium (VTS '03), Apr. 2003; 6 pages; © 2003.

"Reducing Test Power, Time and Data Volume in SoC Testing Using Selective Trigger Scan Architecture," by Shervin Sharifi, Mohammad Hosseinabadi, Pedram Riahi and Zainalabedin Navabi; Electrical and Computer Engineering, University of Tehran; 14399 Tehran, Iran, and Northeastern University, Boston, Massachusetts 02115; International Symposium on Defect and Fault Tolerance in VLSI Systems (DFT '03); 9 pages, © 2003.

"A Novel Scan Architecture for Power-Efficient, Rapid Test," by Ozgur Sinanoglu and Alex Orailoglu; Computer Science and Engineering Department, University of California, San Diego, La Jolla, CA 92093; International Conference on Computer-Aided Design (ICCAD '02), pp. 299-303, Nov. 2002; © 2002.

"Test Cost Reduction Through a Reconfigurable Scan Architecture," by Baris Arslan and Alex Orailoglu, Computer Science and Engineering Department, University of California, San Diego, La Jolla, CA 92093; ITC International Test Conference, Paper 33.4, pp. 945-952; Nov. 2004; © 2004.

"Random Access Scan: A Solution to Test Power, Test Data Volume and Test Time," by Dong Hyun Baik, Kewal K. Saluja, and Seiji Kajihara, University of Wisconsin-Madison, Department of Electrical and Computer Engineering, Madison, WI 53706 and Kyushiu Institue of Tech., Department of Computer Sciences and Electronics, Iizuka 820-8502 Japan; Proceedings of the $17^{th}$ International Conference on VLSI Design (VLSID'04); pp. 883-888, Jan. 2004; © 2004.

"Minimizing Power Consumption in Scan Testing: Patter Generation and DFT Techniques," by Kenneth M. Butler, Jayashree Saxena, Tony Fryars, Graham Hetherington, Atul Jain, and Jack Lewis, Texas Instruments Inc., Dallas, TX 75243; ITC International Test Conference; pp. 355-364, Nov. 2004; © 2004.

"Logic BIST with Scan Chain Segmentation," by Liyang Lai, Janak H. Patel, Thomas Rinderknecht, Wu-Tung Cheng; Coordinate Science Laboratory, University of Illinois at Urbana-Champaign, 1308 West Main Street, Urbana, IL 61801-2307, and Mentor Graphics Corp., 8005 S. W. Boeckman Road, Wilsonville, OR 97070-7777; ITC International Test Conference; pp. 57-66, Nov. 2004; © 2004.

* cited by examiner

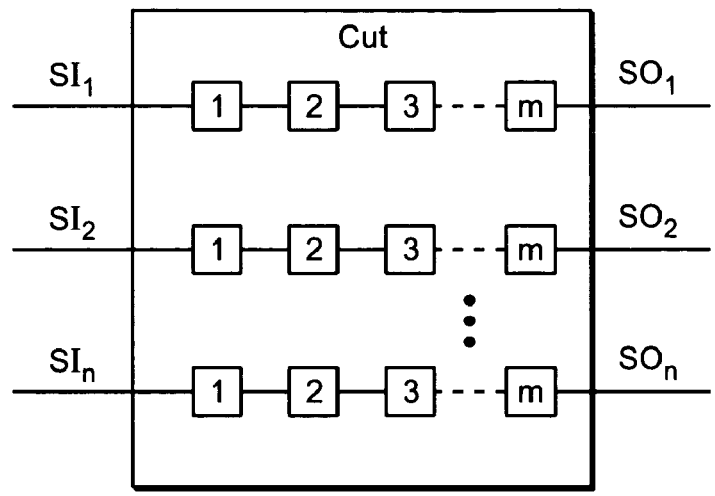
FIG._1
*(PRIOR ART)*
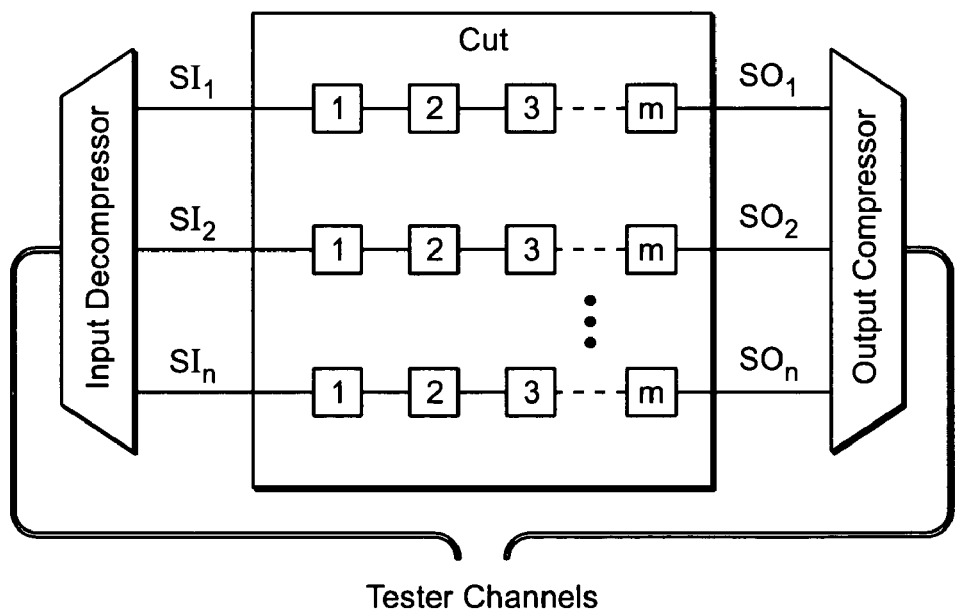
FIG._2
*(PRIOR ART)*

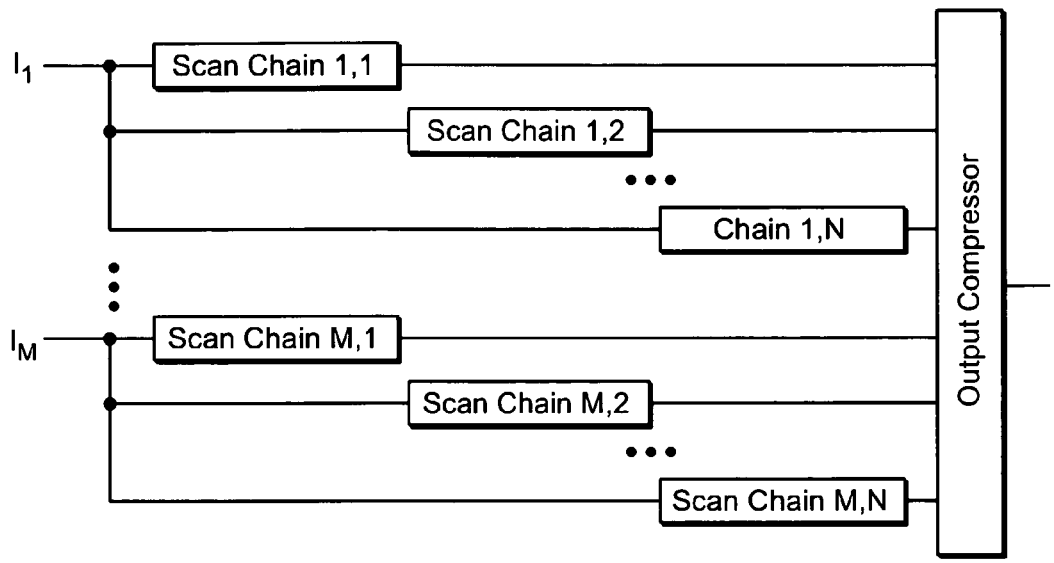
FIG._3
*(PRIOR ART)*
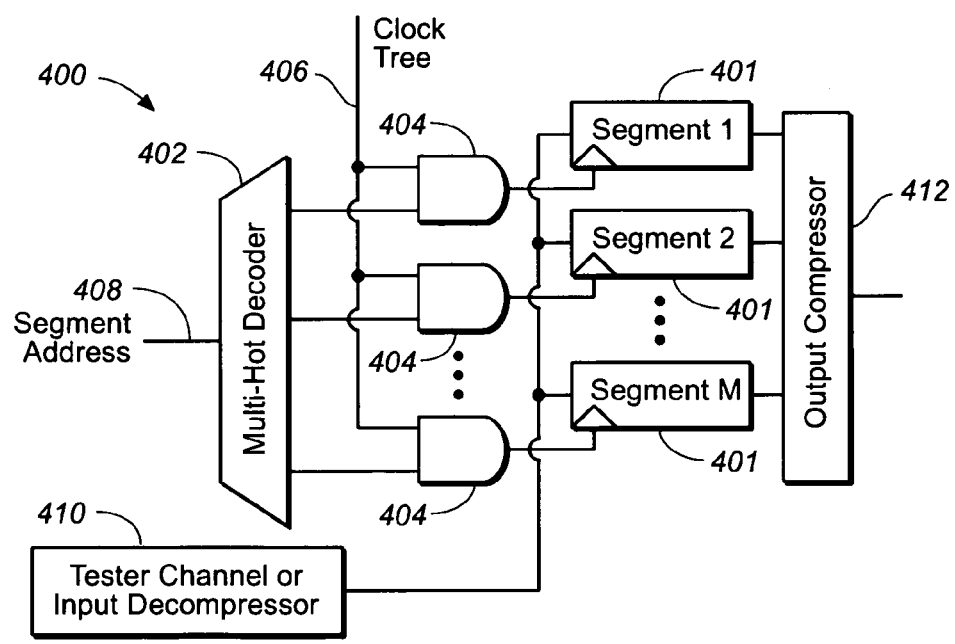
FIG._4

Pattern:
0X11XXX0110X0XX101X1X11X0X011X
Segment 1:   0X11X
Segment 2:   XX011
Segment 3:   0X0XX
Segment 4:   101X1
Segment 5:   X11X0
Segment 6:   X011X
FIG._5
Class 1 =   {Segment 1, Segment 5} = 01110
Class 2 =   {Segment 2, Segment 3} =0X011
Class 3 =   {Segment 4, Segment 6} =10111
FIG._6
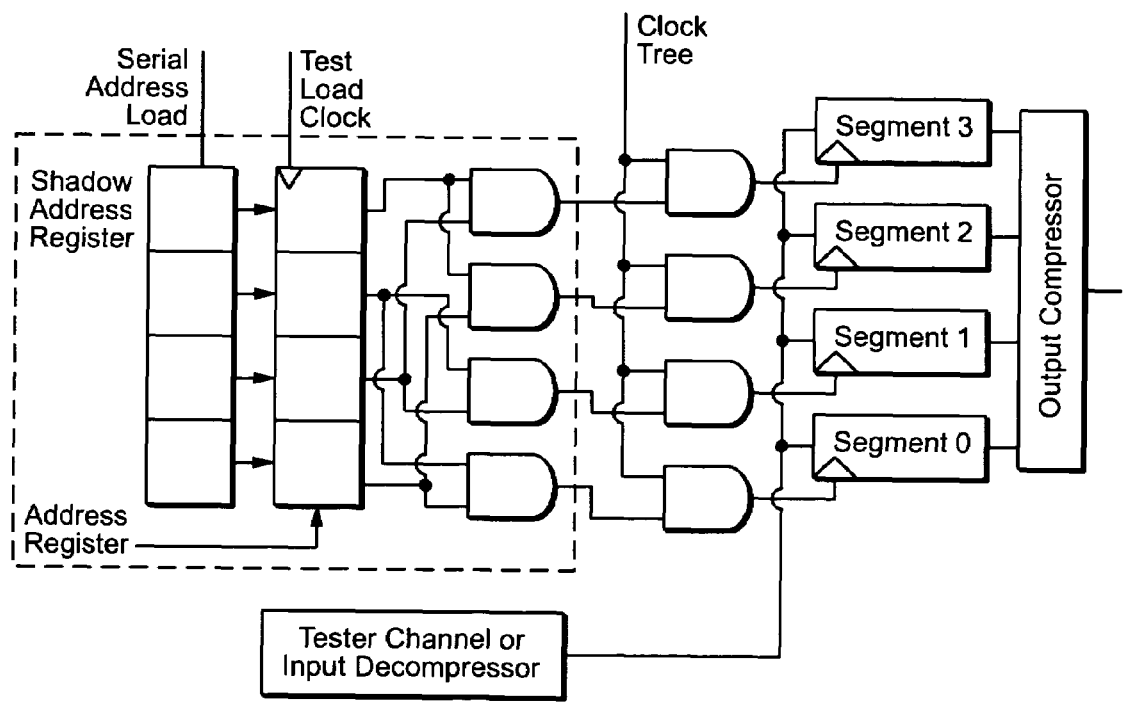
FIG._7

1. Classify all detectable faults as undetected
2. Start with the configuration *dd...d*
3. While (there are undetected faults)
4.    Generate ATPG patterns
5.    If the address care bit(s) are not the least significant
6.      Move address care bits to lower significance
7.    Else
8.      Increase the number of care bits in address
9.      Make the care bits the most significant
10.    Endif
11. Endwhile
12. End

FIG._8

|  | Flip-Flops | Gate Count | Clock Domains | Test Patterns |
|---|---|---|---|---|
| Ckt1 | 29K | 350K | 10 | 1.5K |
| Ckt2 | 35.5K | 450K | 26 | 3.4K |

FIG._11

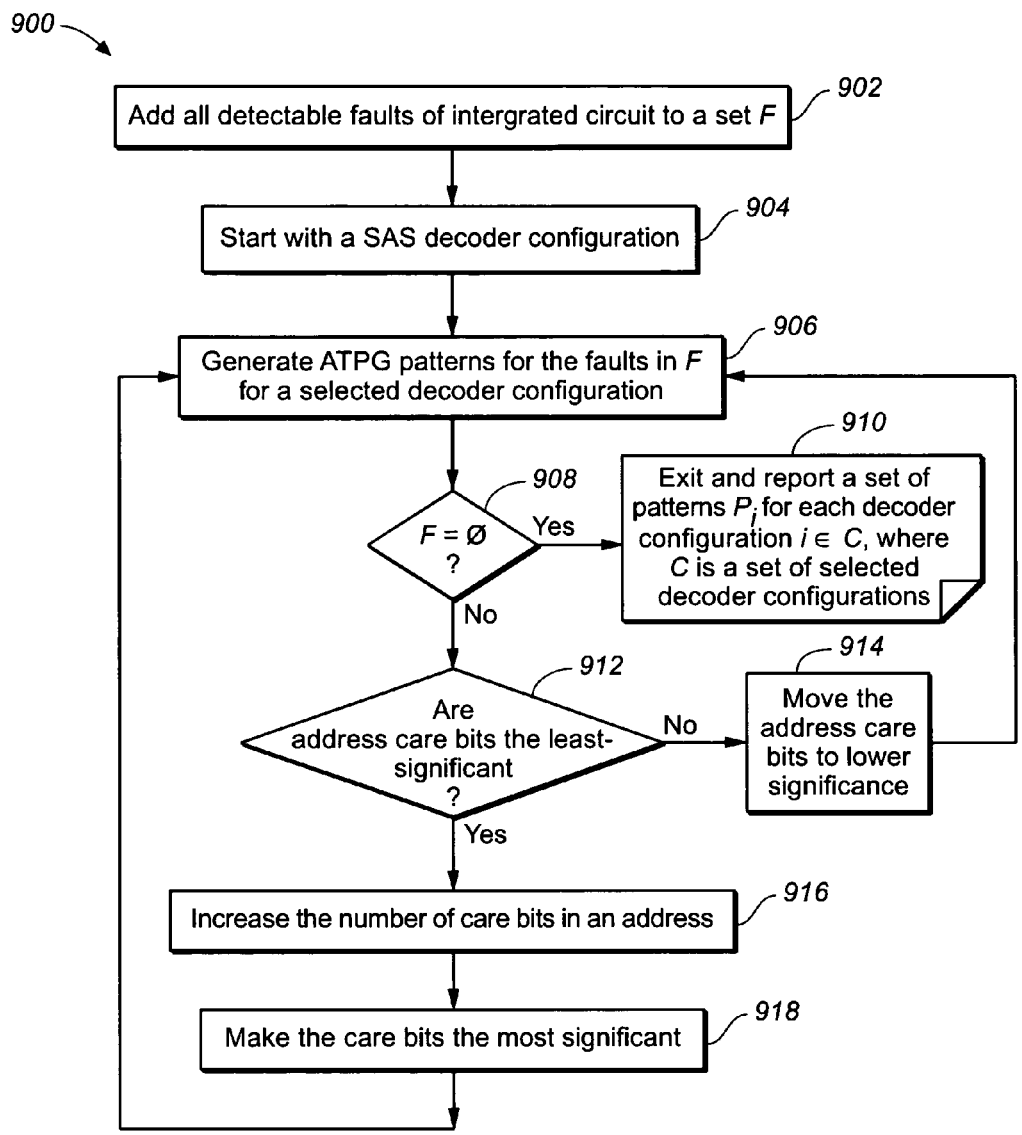
FIG._9

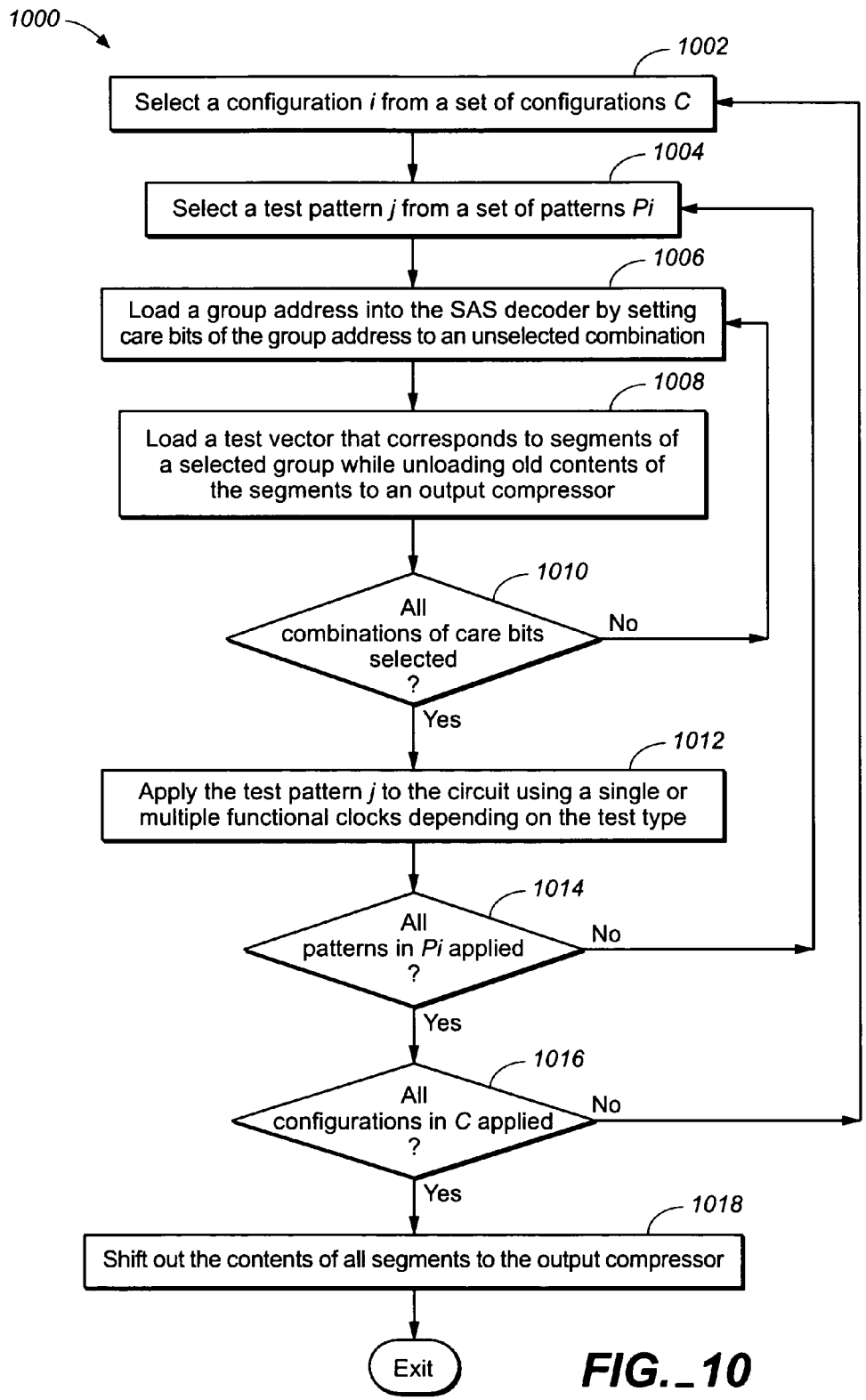
FIG._10

| Ckt1 | | | |
|---|---|---|---|
| Total Data Volume | | 40 Mb | Comp Ratio |
| SAS Data Volume | 32 Segments | 3.3 Mb | 12x |
| | 64 Segments | 2.4 Mb | 16x |
| | 128 Segments | 2.0 Mb | 19x |
| | 256 Segments | 1.9 Mb | 21x |
| Ckt2 | | | |
| Total Data Volume | | 120 Mb | Comp Ratio |
| SAS Data Volume | 32 Segments | 7.5 Mb | 16x |
| | 64 Segments | 5.8 Mb | 20x |
| | 128 Segments | 4.8 Mb | 25x |
| | 256 Segments | 3.7 Mb | 32x |

*FIG. 12*

| Ckt1 | | | |
|---|---|---|---|
| Total Data Volume | | 98 Mb | Comp Ratio |
| SAS Data Volume | 32 Segments | 7.7 Mb | 12x |
| | 64 Segments | 5.3 Mb | 18x |
| | 128 Segments | 4.5 Mb | 22x |
| | 256 Segments | 3.6 Mb | 27x |
| Ckt2 | | | |
| Total Data Volume | | 300 Mb | Comp Ratio |
| SAS Data Volume | 32 Segments | 21.7 Mb | 14x |
| | 64 Segments | 14.1 Mb | 21x |
| | 128 Segments | 11.8 Mb | 25x |
| | 256 Segments | 7.7 Mb | 39x |

*FIG. 13*

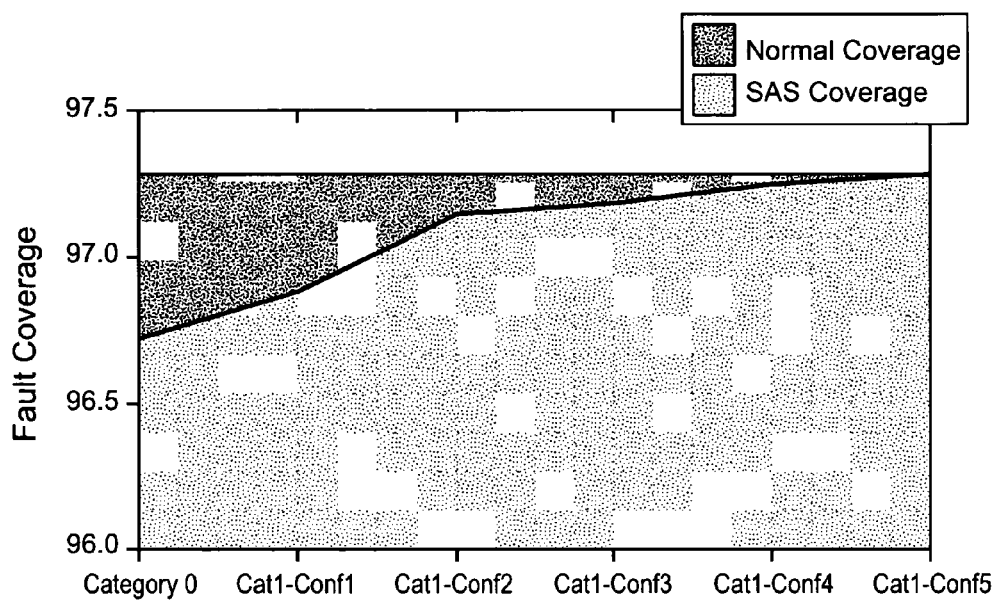
FIG._14
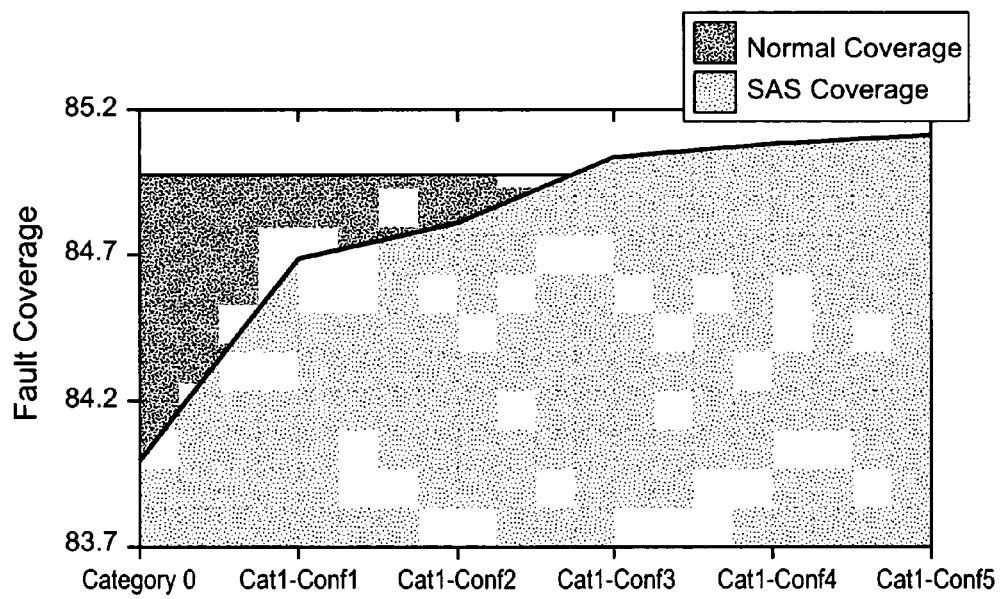
FIG._15

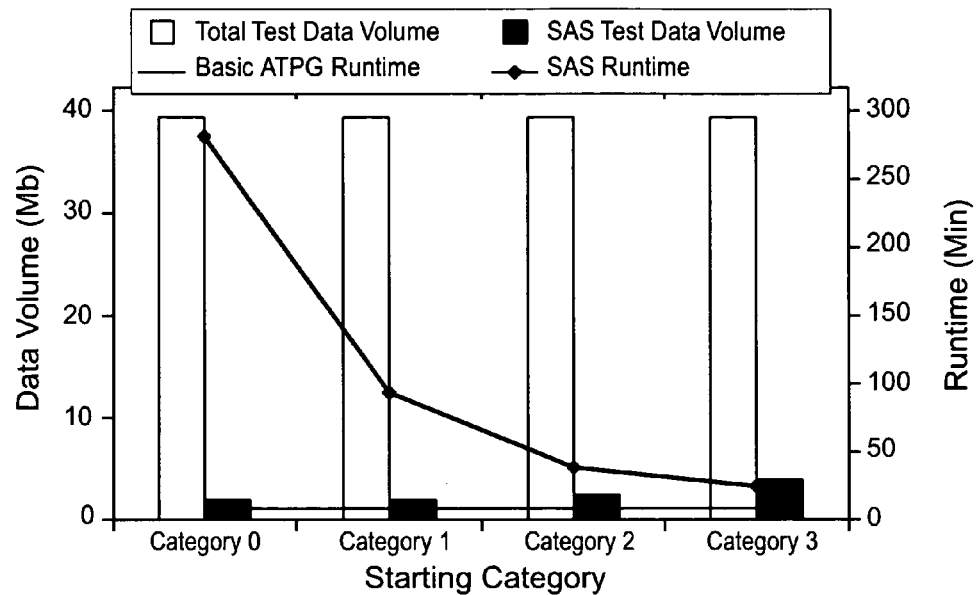
FIG._16
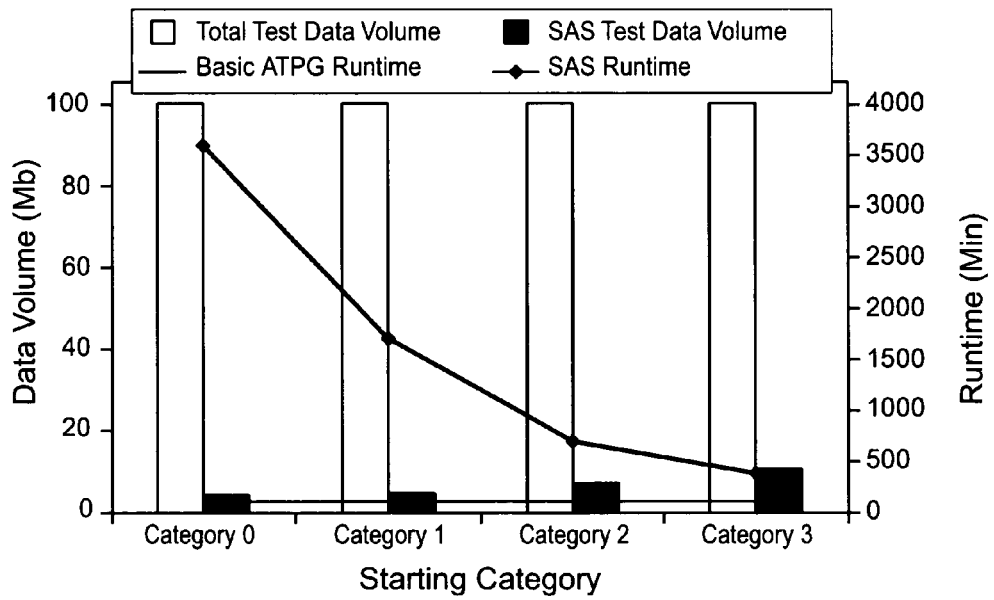
FIG._17

METHOD FOR IMPLEMENTING TEST GENERATION FOR SYSTEMATIC SCAN RECONFIGURATION IN AN INTEGRATED CIRCUIT

CROSS-REFERENCE TO RELATED DOCUMENTS

The present U.S. patent application Ser. No. 11/097,936, filed Mar. 31, 2005, now U.S. Pat. No. 7,206,983, issued Apr. 17, 2007, entitled "Segmented Addressable Scan Architecture and Method for Implementing Scan-Based Testing of Integrated Circuits", is herein incorporated by reference in its entirety.

FIELD OF THE INVENTION

The present invention generally relates to the field of integrated circuits, particularly to methods for implementing test generation and test application for systematic scan reconfiguration in an integrated circuit.

BACKGROUND OF THE INVENTION

As integrated circuits are produced with greater and greater levels of circuit density, efficient testing schemes that guarantee very high fault coverage while minimizing test costs and chip area overhead have become essential. However, as the complexity of circuits continues to increase, high fault coverage of several types of fault models becomes more difficult to achieve with traditional testing paradigms. This difficulty arises for several reasons. First, larger integrated circuits have a very high and still increasing logic-to-pin ratio that creates a test data transfer bottleneck at the chip pins. In addition, larger circuits require a prohibitively large volume of test data that must be then stored in external testing equipment. Moreover, applying the test data to a large circuit requires an increasingly long test application time. Furthermore, present external testing equipment is unable to test such larger circuits at their speed of operation.

Integrated circuits are presently tested using a number of structured design for testability (DFT) techniques. The scan-path method is a widely used DFT technique. It is based on serialization of test data (see E. J. McCluskey, *Logic Design Principles with Emphasis on Testable Semicustom Circuits*, Prentice-Hall, Englewood Cliffs, N.J., USA, 1986). In scan-based testing, the flip-flops in the circuit under test are connected together to form one or multiple scan chains. Through these scan chains, arbitrary test patterns can be shifted into the flip-flops and applied to different parts of the circuit. The main advantage of scan testing is improving the controllability and observability of the circuit under test by having direct access to the states of the flip-flops.

In scan-path methods, the circuit is designed so that it has two modes of operation: a normal functional mode and a scan mode. In the scan mode, the flip-flops in the circuit are connected as a shift register so that it is possible to shift an arbitrary test pattern into the flip-flops. The test pattern is applied by returning the circuit to the normal mode for one clock cycle during which the contents of the flip-flops are applied to the combinational circuitry and the outputs of the combinational circuitry are stored back in the flip-flops. The circuit can then be placed in the scan mode to shift out the contents of the flip-flops and compare them with the correct response. Shifting the response out may be implemented concurrently while shifting in a new test pattern.

Scan-based testing of VLSI (Very Large Scale Integration) circuits is widely used due to its simplicity and the fact that it permits more thorough testing of the circuit. However, it suffers from the following four problems: (1) data volume: Every test pattern requires N bits of storage where N=number of primary inputs+number of flip-flops in the design. With hundreds of thousands of flip-flops and tens of thousands of patterns, the data volume is in Gigabits and the problem is only getting worse; (2) test time: Scanning-in a test pattern is a time consuming process. For example, if the length of the longest scan chain is 4,000 flip-flops, every test pattern needs 4,000 clock cycles to be shifted in the scan chains. Scanning the pattern is normally done at slow speed due to circuit limitations. This problem contributes significantly to the test cost since test time is a major component in that cost function; (3) power consumption: In normal operation, a small portion of the circuit is active at the same time. During scan-in and scan-out, all flip-flops are toggled to shift the pattern in and the response out. This high activity may damage the circuit. One way to deal with it is to apply the scanning at a low speed which makes test time worse; and (4) tester channels: The cost of testers is directly dependent on the number of channels it supports. A solution that would enable testing a circuit with a lower requirement on the number of tester channels should result in reduction in test cost.

Shifting a test pattern into the scan chains is a time consuming process. If the circuit has a single scan chain, shifting a test pattern takes as many clock cycles as there are flip-flops in the circuit. The stumps architecture, shown in FIG. 1, groups the flip-flops into multiple scan chains to enable loading a test pattern into the scan chains in parallel. However, it requires a tester channel per scan chain input to load the test pattern and a tester channel per scan chain output to shift out the circuit response.

Several compression techniques have been presented to reduce the data volume and the tester channel requirements. A generic architecture for such techniques is shown in FIG. 2. With such techniques, a compressed vector is loaded from the tester into the decompression circuitry, which expands the vector into a test pattern in the scan chains. The test response is also compressed into a smaller vector using the output compression circuitry. For example, compression techniques were discussed in B. Koenemann "LFSRCoded Test Patterns for Scan Designs," *European Test Conference (ETC'91)*, pp. 237-242, 1991; E. J. McCluskey, D. Burek, B. Koenemann, S. Mitra, J. Patel, J. Rajski and J. Waicukauski, "Test Data Compression," *Design & Test of Computers, Vol.* 20, No. 2, pp. 76-87, March-April 2003; A. Al-Yamani and E. J. McCluskey, "Seed Encoding for LFSRs and Cellular Automata," *40th Design Automation Conference (DAC'03)*, June 2003; and J. Rajski, J. Tyszer, M. Kassab and N. Mukherjee, "Embedded Deterministic Test," *IEEE Transactions on Computer-Aided Design (TCAD)*, Vol. 23, No. 5, pp. 776-792, May 2004. These techniques reduce the test data volume by applying linear compression techniques to the test data. These techniques rely on having a decompression circuit on the chip to decompress the data coming from the tester. This may also reduce the tester channel requirements because the test data is loaded into the decompression circuitry. However, such compression schemes offer a limited improvement to test time and fail to address power consumption.

Scan segmentation approaches rely on segmenting the scan chains into multiple segments. If the segments have compatible data they are loaded in parallel. If not, the data is loaded serially. Depending on chances of compatibility, these approaches may reduce test data volume, test time and tester channel requirements. However, for segmentation schemes, chances of compatibility become smaller as the number of segments increases. Thus, such schemes do not allow for taking advantage of an aggressive segmentation that would lead to shorter test time. Also, such schemes fail to address power consumption. For example, Illinois Scan Architecture (ISA) was introduced in I. Hamzaoglu and J. Patel, "Reducing Test Application Time for Full Scan Embedded Cores" *IEEE International Symposium on Fault Tolerant Computing (FTC'99)*, pp. 260-267, 1999 to reduce data volume and test application time by splitting the scan chain into multiple segments to reduce test data volume and test application time. The basic architecture for Illinois scan is shown in FIG. 3. A given scan chain is split into multiple segments. Since a majority of the bits in ATPG (Automatic Test Pattern Generation) patterns are don't-care bits, there are chances that these segments may have compatible vectors (i.e., not having opposite care-bits in one location). In this case, all segments of a given chain are configured in a broadcast mode to read the same vector. This speeds up the test vector loading time and reduces the data volume by a factor equivalent to the number of segments. When the segments within a given scan chain are incompatible, the test vector needs to be loaded serially by reconfiguring the segments into a single long scan chain. The fact that a majority of the ATPG bits (95-99%, see T. Hiraide, K.O. Boateng, H. Konishi, K. Itaya, M. Emori and H. Yamanaka, "BIST-Aided Scan Test—A New Method for Test Cost Reduction," *VLSI Test Symposium (VTS'03)*, pp. 359-364, April 2003) are don't-care bits makes ISA an attractive solution for data volume and test time.

Several enhancements to the scan architecture have been proposed and discussed for multiple reasons. Lee et al. presented a broadcasting scheme where ATPG patterns are broadcasted to multiple scan chains with a core or across multiple cores, and the broadcast mode is used when the vectors going into multiple chains are compatible (see K-J. Lee, J-J. Chen and C-H. Huang, "Broadcasting Test Patterns to Multiple Circuits," *IEEE Transactions on Computer-Aided Design (TCAD)*, Vol. 18, No. 12, pp. 1793-1802, December 1999). A token scan architecture was introduced to gate the clock to different scan segments while taking advantage of the regularity and periodicity of scan chains (see T-C. Huang and K-J. Lee, "A Token Scan Architecture for Low Power Testing," *International Test Conference (ITC'01)*, pp. 660-669, October 2001). Another scheme for selective triggering of scan segments was proposed in S. Sharifi, M. Hosseinabadi, P. Riahi and Z. Navabi, "Reducing Test Power, Time and Data Volume in SoC Testing Using Selective Trigger Scan Architecture," *International Symposium on Defect and Fault Tolerance (DFT'03)*, 2003.

A novel scheme was presented in O. Sinanoglu and A. Orailoglu, "A Novel Scan Architecture for Power-Efficient, Rapid Test," *International Conference on Computer-Aided Design (ICCAD'02)*, pp. 299-303, November 2002 to reduce test power consumption by freezing scan segments that do not have care-bits in the next test stimulus. By only loading the segments that have care-bits, data volume, application time, and test power consumption are all reduced at once. Only one segment of the scan chain is controlled and observed at a time.

A reconfigurable scheme was introduced in S. Samaranayake, E. Gizdarski, N. Sitchinava, F. Neuveux, R. Kapur and T. Williams, "A Reconfigurable Shared Scan-in Architecture," *VLSI Test Symposium (VTS'03)*, April 2003 to use mapping logic to control the connection of multiple scan chains. This increases the chances of compatibility between multiple chains and hence makes room for additional compaction.

A new scan architecture was proposed in D. Xiang, J. Sun, M. Chen and S. Gu, "Cost-Effective Scan Architecture and a Test Application Scheme for Scan Testing with Non-scan Test Power and Test Application Cost," U.S. Patent Application Publication No. 20040153978, filed Dec. 19, 2003, published Aug. 5, 2004 to order the scan cells and connect them based on their functional interaction.

A circular scan scheme was presented in A. Arslan and A. Orailoglu, "CircularScan: A Scan Architecture for Test Cost Reduction," *Design, Automation and Test in Europe Conference and Exhibition (DATE'04)*, Vol. 2, pp. 1290-1295, Feb. 2004 to reduce test data volume. The basic concept is to use a decoder to address different scan chains at different time. This increases the number of possible scan chains ($2^{N-1}$ for an N-input decoder). Also, the output of each scan chains is reconnected to its input. This enables reusing the contents of the response captured in the chain as a new test stimulus if they are compatible.

These previous schemes are either limited in how much they can benefit from compatibility between some of the segments or fail to address the issue of power consumption during scan or both.

Another attempt for using decoder-based segmentation is available in P. Rosinger, B. M. Al-Hashimi, and N. Nicolici, "Scan Architecture With Mutually Exclusive Scan Segment Activation for Shift- and Capture-Power Reduction," *IEEE Transactions on Computer-Aided Design (TCAD)*, Vol. 23, No. 7, pp. 1142-1153, July 2004. In this scheme the clocks to various segments are controlled through a regular decoder. The main advantage of the scheme is power reduction during scan and capture. However, the solution does not address data volume, or test application time.

Recently, a scan chain segmentation technique was presented in L. Lay, J. Patel, T. Rinderknecht, and W-T. Cheng, "Logic BIST with Scan Chain Segmentation," *International Test Conference (ITC'04)*, pp. 57-66, November 2004. The technique is a BIST solution that selectively inserts inversions at some locations in the scan path based on the ATPG patterns to minimize the number of weights required for weighted random patterns to achieve the desired coverage.

The technique in B. Arslan and A. Orailoglu, "Test Cost Reduction Through a Reconfigurable Scan Architecture," *International Test Conference (ITC'04)*, pp. 945-952, November 2004 is a recent attempt for test cost reduction through scan reconfiguration. The technique is based on finding the matches between the test response of pattern n and the bits of pattern n+1. However, this technique may require very high routing overhead due to the individual addressing of flip-flops just like random access scan presented in H. Ando, "Testing VLSI with Random Access Scan," *IEEE Computer Society Conference (COMPCON'80)*, pp. 50-52, Feb., 1980 and enhanced in D. H. Baik, K. K. Saluja, and S. Kajihara, "Random Access Scan: A solution to test power, test data volume, and test time," *International Conference on VLSI Design (VLSID'04)*, pp. 883-888, Jan. 2004. They also felt that the matching could be done with a pseudorandom sequence generated from an LFSR and the match will be equally probable.

In general, these previous techniques that would address one of the foregoing described four problems associated with scan-based testing of VLSI circuits would normally make another problem worse or in the best case not address it. Moreover, the solutions that allow multiple configurations for compatibility do so using mapping logic hardware. However, this hardware may get larger as higher flexibility is needed. Also, changing the design at a late stage (engineering change orders ECOs) may require changing the mapping logic hardware, which causes delay in time to market. In addition, most of the existing solutions for the four foregoing described problems rely on information provided by automatic test pattern generation tools (ATPG tools) about the unspecified bits. However, some ATPG vendors do not provide such information and consider it confidential. Currently there is no solution in the industry that deals with these problems without requiring these unspecified bits information.

Thus, it would be desirable to provide a new test data compression technique which may achieve high compression ratios without requiring any information from the ATPG tool about the unspecified bits.

SUMMARY OF THE INVENTION

In an exemplary aspect, the present invention provides a method for implementing test generation for systematic scan reconfiguration in an integrated circuit. All detectable faults of the integrated circuit are added to a set F. A SAS decoder configuration is selected to start with. ATPG patterns are generated for the faults in the set F for the selected decoder configuration. When F=Ø, a set of patterns $P_i$ is reported for each decoder configuration i∈C, where C is a set of selected decoder configurations.

In an additional exemplary aspect, the present invention provides a method or process for implementing test application for systematic scan reconfiguration in an integrated circuit. A configuration i is selected from a set of configurations C. A test pattern j is selected from a set of patterns $P_i$. A group address is loaded into a SAS decoder by setting care bits of the group address to an unselected combination. A test vector corresponding to segments of a selected group is loaded while old contents of the segments are unloaded to an output compressor. When at least one combination of care bits is not selected, the process returns to the step of loading a group address.

It is to be understood that both the foregoing general description and the following detailed description are exemplary and explanatory only and are not restrictive of the invention as claimed. The accompanying drawings, which are incorporated in and constitute a part of the specification, illustrate an embodiment of the invention and together with the general description, serve to explain the principles of the invention.

BRIEF DESCRIPTION OF THE DRAWINGS

The numerous advantages of the present invention may be better understood by those skilled in the art by reference to the accompanying figures in which:

FIG. 1 is a schematic diagram illustrating a prior art multiple scan chains architecture;

FIG. 2 is a schematic diagram illustrating a prior art generic architecture for input and output compression;

FIG. 3 is a schematic diagram illustrating a prior art Illinois scan architecture;

FIG. 4 is a schematic diagram illustrating a segmented addressable scan (SAS) architecture in accordance with an exemplary embodiment of the present invention;

FIG. 5 shows an exemplary 30-bit test pattern;

FIG. 6 shows that the 30-bit test pattern illustrated in FIG. 5 can be split into three compatibility classes in accordance with an exemplary embodiment of the present invention;

FIG. 7 is a schematic block diagram of a SAS architecture with 4 segments in accordance with an exemplary embodiment of the present invention;

FIG. 8 shows a general algorithm for Systematic Scan Reconfiguration (SSR) in accordance with an exemplary embodiment of the present invention;

FIG. 9 is a flow diagram of a method for implementing test generation for systematic scan reconfiguration in an integrated circuit in accordance with an exemplary embodiment of the present invention;

FIG. 10 is a flow diagram of a method for implementing test application for systematic scan reconfiguration in an integrated circuit in accordance with an exemplary embodiment of the present invention;

FIG. 11 describes characteristics of two exemplary circuits Ckt1 and Ckt2;

FIG. 12 shows the compression ratios achieved by SSR for stuck-at test patterns using different number of segments for the circuits Ckt1 and Ckt2 described in FIG. 11 in accordance with an exemplary embodiment of the present invention;

FIG. 13 shows the compression ratios achieved by SSR for transition fault patterns using different number of segments for the circuits Ckt1 and Ckt2 described in FIG. 11 in accordance with an exemplary embodiment of the present invention;

FIG. 14 is a schematic diagram illustrating the fault coverage vs. the categories and configurations used for the circuit Ckt1 described in FIG. 11 with 32 segments for the single-stuck model in accordance with an exemplary embodiment of the present invention;

FIG. 15 is a schematic diagram illustrating the fault coverage vs. the categories and configurations used for the circuit Ckt1 described in FIG. 11 with 32 segments for the transition fault model in accordance with an exemplary embodiment of the present invention;

FIG. 16 is a schematic diagram illustrating the reduction in runtime and the increase in stuck-at data volume as a function of the staring category for SSR for the 128 segments configuration of the circuit Ckt1 described in FIG. 11 in accordance with an exemplary embodiment of the present invention; and FIG. 17 is a schematic diagram illustrating the reduction in runtime and the increase in transition data volume as a function of the staring category for SSR for the 128 segments configuration of the circuit Ckt1 described in FIG. 11 in accordance with an exemplary embodiment of the present invention.

DETAILED DESCRIPTION OF THE INVENTION

Reference will now be made in detail to the presently preferred embodiments of the invention, examples of which are illustrated in the accompanying drawings.

The present invention provides a new test data compression technique that may achieve 10× (10 times) to 20× (20 times) or higher compression ratios without requiring any information from the ATPG tool about the unspecified bits. The technique may be applied to both single-stuck and transition fault test sets. The technique allows aggressive parallelization of scan chains leading to similar reduction in test time. It also reduces tester pins requirements by similar ratios. The technique is implemented using a hardware overhead of a few gates per scan chain.

The co-pending United States patent application Ser. No. 11/097,936, entitled "Segmented Addressable Scan Architecture and Method for Implementing Scan-Based Testing of Integrated Circuits", filed Mar. 31, 2005 disclosed a new architecture and circuitry for significantly reducing test data volume, test application time, test power consumption and tester channel requirements. The architecture, called Segmented Addressable Scan (SAS), is based on ISA but it enables much more aggressive segmentation of the scan chains by enabling many different compatibility configurations among multiple segments. SAS is based on the availability of don't-care bits in test patterns. It is well known that a majority of the ATPG bits (95-99%, see T. Hiraide, K. O. Boateng, H. Konishi, K. Itaya, M. Emori and H. Yamanaka, "BIST-Aided Scan Test—A New Method for Test Cost Reduction," *VLSI Test Symposium (VTS'03)*, pp. 359-364, April 2003) are don't-care bits, and these bits are used as a basis for some compression and power consumption solutions. However, it is almost infeasible to obtain the information about don't-care bits from some ATPG vendors since they consider it confidential. Currently there is no solution in the industry that deals with these problems without requiring the don't-care bits information.

The present invention presents Systematic Scan Reconfiguration (SSR). SSR is a compression solution that does not require any information about don't-care bits. Yet, it may achieve 10× (10 times) to 20×(20 times) or higher reduction in test data volume, test application time, and tester channel requirements. With the same minimal hardware overhead as SAS, SSR achieves this major cost reduction through modifying the ATPG process instead of utilizing the don't-care bits.

A. Segmented Addressable Scan (SAS)

The SAS (Segmented Addressable Scan) architecture is based on segmenting the scan chain into multiple segments. For a given test pattern, compatible segments are grouped together into compatibility classes. A multiple-hot decoder (MHD) is used to select all compatible segments within a given compatibility class. For a compatibility class, a given address is loaded into the multiple-hot decoder to refer to a single or multiple segments. The simultaneous loading of compatible segments may allow the SAS architecture to benefit from the compatibility between the segments even when not all segments are compatible. One way for the multiple-hot decoder to activate/deactivate the segments is by gating the clock that controls those segments (see FIGS. 4 and 7). Another way is to use a 2-to-1 multiplexer at the input to each segment (not shown). A regular one-hot decoder may take advantage of partial compatibility for data volume reduction only. The multiple-hot decoder used in the SAS architecture reduces test time also based on this compatibility since the compatibility classes are loaded in parallel.

The implementation of the multiple-hot decoder is achieved through encoding the values 0, 1 and d (don't-care) in the input to the decoder. Due to encoding the don't-care values, the decoder may activate multiple segments. The decoder is implemented by: (a) choosing codes for 0, 1, and d (e.g. 0=01, 1=10 and d=11), and if the decoder receives an address that includes a don't-care bit, it activates all segments for which this don't-care bit is a 1 or a 0; and (b) the function is tabulated based on the encoding, and the decoder hardware is implemented based on this function.

Multiple segments may be loaded simultaneously while maintaining the freedom of deciding which segments are grouped together for a given test pattern. Such reconfiguration of compatibility allows for significant additional compaction, thereby leading to gains in data volume. It also enables aggressive parallelization of the scan chains, resulting in reduction in test application time. Moreover, the compatible segments may be loaded in parallel using a multiple-hot decoder instead of loading them serially, and this further reduces the time required to load the scan chains. Further, the segments that are not loaded within a given round are not clocked, resulting in power savings which in turn allows for faster clocking of the test patterns within the same power budget.

The SAS architecture has the following distinguishing features. First, multiple segments can be loaded simultaneously while maintaining the freedom of selecting which segments are grouped together within a given test pattern. Unlike the technique in S. Samaranayake, E. Gizdarski, N. Sitchinava, F. Neuveux, R. Kapur and T. Williams, "A Reconfigurable Shared Scan-in Architecture," *VLSI Test Symposium (VTS'03)*, April 2003, this is done without additional mapping logic. Such reconfiguration of compatibility allows for significant additional compaction, leading to gains in data volume. It also enables aggressive parallelization of the scan chains leading to reduction in test application time. Additionally, the compatible segments are loaded in parallel using a multiple-hot decoder instead of loading them serially, and this further reduces the time required to load the scan chains. For most of the previous schemes, if only a subset of the segments satisfies compatibility, that subset cannot be loaded in parallel. The scheme in S. Samaranayake, E. Gizdarski, N. Sitchinava, F. Neuveux, R. Kapur and T. Williams, "A Reconfigurable Shared Scan-in Architecture," *VLSI Test Symposium (VTS'03)*, April 2003 allowed for subsets of segments to be loaded in parallel. However, it allowed that through logic mapping hardware. Such hardware is very inflexible compared to SAS architecture in terms of grouping different subsets of segments for each pattern. SAS architecture with S segments allows for $3^{\lceil \log_2 S \rceil}$ different configurations inherently while the technique mentioned above requires a multiplexer with $3^{\lceil \log_2 S \rceil}$ inputs per scan segment for the same level of flexibility. Moreover, the segments that are not loaded within a given round are not clocked, resulting in power savings which in turn allows for faster clocking of the test patterns within the same power budget.

The basic blocks of an exemplary SAS architecture 400 are shown in FIG. 4. The architecture 400 may be implemented with a single decoder for the entire design or multiple decoders for multiple scan chains. The multiple-hot decoder (MHD) 402 is used to activate all compatible segments within a given compatibility class. A given address is loaded into the MHD to refer to a single or multiple segments. The multiple activations of compatible segments allow the architecture 400 to benefit from the compatibility between the segments even when not all segments are compatible. This gives a significant advantage over previous segmentation techniques. The SAS architecture 400 includes M segments 401 of a scan chain, M being a positive integer. M 2-input AND gates 404 are communicatively coupled to a clock tree 406 and to the segments 401. The multiple-hot decoder 402 is communicatively coupled to the 2-input AND gates 404 for receiving an address 408 as input and for activating at least one segment of the segments 401 through the 2-input AND gates 404 based on the address 408. The SAS architecture 400 may include a tester channel or input decompressor 410 for providing at least one test pattern to the segments 401 and an output compressor 412 for compressing output received from the segments 401.

The 30-bit test pattern shown in FIG. 5 may be used as an example. The scan cells are assumed to be segmented into 6 5-bit segments as shown in FIG. 5, where X indicates a don't-care bit. If a regular segmentation scheme (e.g., ISA) is applied to the pattern, one may not be able to take advantage of partial compatibilities between segments. In other words, one may have to store and scan in the entire 30 bits. However, because of the present segmentation scheme, the pattern shown in FIG. 5 may be split into 3 compatibility classes as shown in FIG. 6. A regular decoder scheme like the ones in A. Arslan and A. Orailoglu, "CircularScan: A Scan Architecture for Test Cost Reduction," *Design, Automation and Test in Europe Conference and Exhibition (DATE'04)*, Vol. 2, pp. 1290-1295, Feb. 2004 and P. Rosinger, B. M. Al-Hashimi, and N. Nicolici, "Scan Architecture With Mutually Exclusive Scan Segment Activation for Shift- and Capture-Power Reduction," *IEEE Transactions on Computer-Aided Design (TCAD)*, Vol. 23, No. 7, pp. 1142-1153, July 2004 would take advantage of the above compatibility for data volume reduction only. Because of the MHD used in the SAS architecture, test time may also be optimized based on this compatibility since the compatibility classes are to be loaded in parallel.

Referring back to FIG. 4, the multiple-hot decoder 402 may take the address of the segment(s) to be enabled and activate the clocks to those segments through the clock gating AND gates 404. For regular one-hot decoders, the input is an address of the selected output. However, for the SAS multiple-hot decoder 402, the address may include don't-care bits (d's), allowing multiple outputs to be activated. For the example shown in FIG. 6, compatibility class 1 may be loaded in parallel by combining the addresses of Segment 1 and Segment 5 {001, 101}, which means that the address for this class is d01. The address for class 2 is 01d, and the address for class 3 is 1d0. For the multiple-hot decoder 402, don't-care bits in the address need to be encoded too. The positional cube notation described in G. De Micheli, *Synthesis and Optimization of Digital Circuits*, McGraw-Hill, 1994 may be used to encode 0s, 1s and don't-cares. The positional cube encoding scheme may result in an implementation for the multiple-hot decoder 402 that requires the same hardware as a regular one-hot address decoder.

In general, if there are M segments, M AND gates each with $2\lceil \log_2 M \rceil$ inputs for the multiple-hot decoder may be used. For clock gating, additional M 2-input AND gates may be used.

The address for a given compatibility class can be loaded in parallel from the tester in which case the number of tester channels needed is $2\lceil \log_2 M \rceil + 1$ (the multiplication by 2 is a result of encoding 3 values 0, 1, and d). It can also be loaded serially. While shifting in a test pattern for one compatibility class, the address for the next compatibility class can be loaded into a shadow register. The total number of flip-flops for the shadow register is $2\lceil \log_2 M \rceil$. The block diagram for SAS architecture with 4 segments and serial loading of address register is shown in FIG. 7.

As an example for SAS hardware overhead, the number of transistors needed for the additional hardware for 256 segments is less than 3,000 transistors i.e., less than 1,000 gates. Using SAS, an order of magnitude or more of reduction in test data volume, test application time, tester channel requirements and test power consumption may be achieved.

B. Systematic Scan Reconfiguration

As it is obvious from the foregoing Section A, the information about the don't-care bits is needed to generate the compatibility classes that are needed for SAS decoder address generation. However, there are two issues with this requirement: (1) Some ATPG vendors do not provide don't-care bits information because they consider it confidential; and (2) A fault can be detected by multiple patterns. With the ATPG unaware of the SAS architecture, the selection of which patterns to generate by the ATPG tool will not be driven by higher compatibility but rather by ease of generation.

To address the foregoing two issues, the present invention presents an algorithm that does not require don't-care bits. Moreover, the present invention may drive the ATPG tool to generate more highly compatible patterns that may require the fewest number of addresses or configurations with SAS architecture.

The SSR algorithm is based on the same SAS hardware presented in the foregoing Section A. It works by configuring the scan chains in the circuit such that they appear to be tied together to the ATPG tool with multiple configurations. The selection of which segments to tie together is implemented such that the number of addresses required to be loaded into the multiple-hot decoder is minimized. Basically, an address corresponds to a subset of the segments. For example, for a 2-to-4 multiple-hot decoder, the address 00 corresponds to segment 0, and so on. In addition, the address 0d (d=don't-care) corresponds to segments 0 and 1. Finally, the address dd corresponds to all 4 segments. Without the SAS architecture, one may choose a multiplicity of configurations and generate patterns with them tied together. However, this may require multiple multiplexers at the inputs and outputs of the scan segments to reconfigure them. It may also either cause problems with engineering changes or require these multiplexers to be highly reconfigurable which translates into high hardware overhead. The high flexibility and simplicity of the SAS architecture may allow for a very large number of configurations ($3^{\lceil \log_2 S \rceil}$, where S is the number of scan segments) with very simple hardware that does not need to be changed with engineering changes.

Physically, all segments in the SAS architecture are tied together. The decoder controls which segments to load together by activating a subset of the clocks connected to these segments based on the address loaded.

The SSR algorithm selects a set of configurations for combining scan segments together and then fakes to the ATPG tool that these segments are tied together so that the ATPG tool generates compatible patterns for them. It continues with these configurations until complete fault coverage is achieved (by complete, it is meant that the same coverage that can be achieved without tying any segments together).

An SAS architecture with 8 segments (the addresses for the individual segments are 000 through 111) may be used as an example to explain the SSR algorithm. First, all segments are tied together and named Category 0. There is only one configuration in this category, which corresponds to the address ddd. The ATPG tool is run with this configuration to detect as many faults as it can. It is noted that during test application, all one needs to do is load the address ddd in the decoder and then start loading the patterns in Category 0. It is also noted that every pattern generated with this configuration is ⅛th (generally 1/S) of the size of the regular pattern (assuming segments are balanced). Most of the time, there may be undetected faults with this configuration. Thus, one may switch to Category 1. In Category 1, only one of the address bits is specified and the remaining bits are all d's. It is noted that there are 3 possible configurations (generally $\lceil \log_2 S \rceil$ configurations) where only one bit is specified. One may start with the configuration cdd, where c stands for a care bit. The care bit may take the value 0 or 1. This means that the addresses 0dd and 1dd are used. These two addresses correspond to tying segments 0, 1, 2, and 3 together and segments 4, 5, 6, and 7 together. One may invoke the ATPG tool to generate patterns and load only the faults that have not been detected with Category 0 patterns. The next configuration within Category 1 is dcd, which corresponds to segments 0, 1, 4, and 5 tied together and segments 2, 3, 6, and 7 tied together. One may again invoke the ATPG tool with the undetected faults. After the last configuration in Category 1, one may go to Category 2 where there are two care bits instead of one. The first configuration is ccd, which corresponds to tying the segments in four groups (0 with 1, 2 with 3, 4 with 5, and 6 with 7). One may continue with these categories and configurations until all detectable faults are detected. The general algorithm for SSR is shown in FIG. 8. Experiments have shown that there is no need to go beyond Category 1.

FIG. 9 is a flow diagram of a method or process 900 for implementing test generation for systematic scan reconfiguration in an integrated circuit in accordance with an exemplary embodiment of the present invention. All detectable faults of the integrated circuit are added to a set F 902. A SAS decoder configuration is selected to start with 904. The starting SAS decoder configuration may be dd . . . d, where all segments are tied. Alternatively, the starting SAS decoder configuration may be cc . . . cdd . . . d, where the most significant address bits are care bits. ATPG patterns are generated for the faults in the set F for the selected decoder configuration 906. Whether F=Ø is checked 908. When F=Ø, a set of patterns $P_i$ is reported for each decoder configuration i∈C, where C is a set of selected decoder configurations and the process 900 ends 910. When F≠Ø, whether address care bits are the least significant is checked 912. When the address care bits are not the least significant, the address care bits are moved to lower significance 914 and the process 900 returns to the step 906. When the address care bits are the least significant, the number of care bits is increased in the address 916. The care bits are made the most significant 918. The process 900 returns to the step 906.

FIG. 10 is a flow diagram of a method or process 1000 for implementing test application for systematic scan reconfiguration in an integrated circuit in accordance with an exemplary embodiment of the present invention. A configuration i is selected from a set of configurations C 1002. A test pattern j is selected from a set of patterns $P_i$ 1004. A group address is loaded into a SAS decoder by setting care bits of the group address to an unselected combination 1006. A test vector corresponding to segments of a selected group is loaded while old contents of the segments are unloaded to an output compressor 1008. Whether all combinations of care bits are selected is checked 1010. When at least one combination of care bits is not selected, the process 1000 returns to the step 1006. When all combinations of care bits are selected, the test pattern j is applied to the integrated circuit using a single or multiple functional clocks depending on the test type 1012. Whether all patterns in the set of patterns $P_i$ are applied is checked 1014. When at least one pattern in the set of patterns $P_i$ is not applied, the process 1000 returns to the step 1004. When all patterns in the set of patterns $P_i$ are applied, whether all configurations in the set of configurations C are applied is checked 1016. When all configurations in the set of configurations C are applied, contents of all segments are shifted out to the output compressor 1018 and the process 1000 ends. When at least one configuration in the set of configurations C is not applied, the process 1000 returns to the step 1002.

Using the SSR algorithm, the ATPG runtime may be very long. However, there are multiple methods to shorten it. The first method is not to try all configurations but to cut the process in the middle and jump to the configuration ccc, which separates all segments from each other. This configuration may detect all remaining detectable faults at any step. An additional method is not to start with the configuration dd . . . d but rather with cd . . . d or ccd . . . d. This may shorten the runtime significantly because the first configuration is the hardest for the ATPG tool. Another method is to reduce the effort level with the first few configurations to the minimum so that the ATPG tool only picks the faults which can be easily detected with compatible patterns.

Not surprisingly, the price for all of these methods is reduction in the compression ratio. The compression ratios that the present invention provides are very high. As a result, the test designer may choose the right mix between the compression ratio and runtime. It is understood that the SSR ATPG runtime is a one time cost while the SSR compression ratio is a recurrent saving.

S. Samaranayake, E. Gizdarski, N. Sitchinava, F. Neuveux, R. Kapur and T. Williams, "A Reconfigurable Shared Scan-in Architecture," *VLSI Test Symposium (VTS'03)*, April 2003 has presented the idea of using multiple configurations of Illinois Scan. However, the present invention has the following distinguishing features: (1) the architecture in S. Samaranayake, E. Gizdarski, N. Sitchinava, F. Neuveux, R. Kapur and T. Williams, "A Reconfigurable Shared Scan-in Architecture," *VLSI Test Symposium (VTS'03)*, April 2003 is based on mapping logic, multiplexers-based added hardware that combines multiple subsets together. The hardware is designed based on reducing the number of compatibilities required because more compatibilities will require more multiplexers and more scan inputs. In addition to the processing time required for these compatibilities, such information about which faults are detectable is only available to ATPG vendors. The present SSR hardware does not require any such information and does not need such extensive processing time. Furthermore, it allows $3^{\lceil log_2 S \rceil}$ different configurations without any additional overhead. For example, a SSR configuration of 256 segments may automatically allow more than 6,500 configurations. For such flexibility, the technique in S. Samaranayake, E. Gizdarski, N. Sitchinava, F. Neuveux, R. Kapur and T. Williams, "A Reconfigurable Shared Scan-in Architecture," *VLSI Test Symposium (VTS'03)*, April 2003 requires 256 6,500-input multiplexers. SSR requires less than 1,000 gate equivalents; (2) For the same example above, the number of tester pins required for SSR is 17 and can be reduced to 2. For the technique in S. Samaranayake, E. Gizdarski, N. Sitchinava, F. Neuveux, R. Kapur and T. Williams, "A Reconfigurable Shared Scan-in Architecture," *VLSI Test Symposium (VTS'03)*, April 2003 to allow similar flexibility, the number of tester channels is more than 6,500 tester pins. It may be argued that not all such configurations are needed to achieve an acceptable compression ratio. However, these configurations may be used to reduce runtime too; (3) Any engineering change orders may alter the compatibilities based on which the hardware in in S. Samaranayake, E. Gizdarski, N. Sitchinava, F. Neuveux, R. Kapur and T. Williams, "A Reconfigurable Shared Scan-in Architecture," *VLSI Test Symposium (VTS'03)*, April 2003 is synthesized. With SSR, all one needs is to select a different set of compatibilities. No hardware changes are needed; (4) SSR inherently offers power reductions by selective activation; and (5) The technique in S. Samaranayake, E. Gizdarski, N. Sitchinava, F. Neuveux, R. Kapur and T. Williams, "A Reconfigurable Shared Scan-in Architecture," *VLSI Test Symposium (VTS'03)*, April 2003 is heavily based on broadcasting mode, which, as will be shown in a later section, is very time-consuming for the ATPG tool and may get worse with more aggressive parallelization, resulting in up to 50× increase in ATPG runtime. As shown in the experimental results, it is very helpful in terms of runtime to use configurations with fewer chains in the broadcast mode. This is something that SSR automatically allows.

C. Power-Optimized SSR

A significant concern with scan-based testing is power consumption. The circuit is designed for a certain power budget in the normal functional mode during which only a fraction of the flip-flop is active. During the scan mode, patterns are shifted into the scan chains, which cause many more flip-flops to switch. This switching increases the dynamic power consumption, which is modeled by $$P = \sum_n \frac{1}{2} c_n \Delta V V_{dd} \alpha_n f$$

where n corresponds to nodes in the circuit, $\alpha_n$ is the average number of times node n switches per cycle, $c_n$ is the capacitance at node n, V is the voltage swing, $V_{dd}$ is the supply voltage and f is the switching frequency. Reducing the scan in and out frequency is a very popular solution to avoid power problems, but this contributes to test time. Another solution is to reduce the activity factor by filling don't-care bits with a repeated value as that of the last care bit. This solution may impact the defect detection quality of the test patterns. A third class of solutions gates the clock to some of the scan chains or segments and activates only a subset of the flip-flops at a time. SSR belongs to the third class in its power saving capability. K. Butler, J. Saxena, T. Fryars, G. Hetherington, A. Jain, and J. Lewis, "Minimizing Power Consumption in Scan Testing: Pattern Generation and DFT Techniques," *International Test Conference (ITC'04)*, pp. 355-364, November 2004, herein incorporated by reference in its entirety, may be referred to for more details about power consumption in scan test and its solutions.

Assume that in normal scan-based testing the maximum shift frequency due to power constraints is f MHz. Since Category 0 patterns (ddd address) activate all segments, the maximum frequency for these patterns is f. For this category, time saving is achieved through loading all segments together which is a S factor saving, where S is the number of segments. For Category 1, with every pattern one may load half of the segments at a time. This means that one is reducing the power consumption by half. Thus, the loading frequency may be doubled safely (all linear components). This means that Category 1 patterns may be loaded at a 2f frequency. Therefore, the speed up for Category 1 is $$2 \times \frac{S}{2} = S.$$

A similar relation scales with all categories. As long as the tester speed allows it, categories that activate smaller subsets of segments may shift patterns at higher speeds. Looking at test time independently from data volume, the optimal segmentation is the one that increases the frequency to the maximum since the ATPG runtime for that category of patterns is smallest due to the reduced constraints. However, it is well known that data volume is a significant test cost factor because the tester memory is limited, which makes the decision a relative significance one.

D. Experiments and Results

SSR experiments have been performed on the circuits Ckt1 and Ckt2 shown in FIG. 11, both of which are 180 nm designs. It is evident from the experiments that SSR achieves better results with bigger designs. FIG. 12 shows the compression ratio achieved by SSR for stuck-at test patterns using different number of segments. Similar data for transition fault patterns is shown in FIG. 13, wherein the results are slightly better. It is obvious that the compression ratio increases as the number of segments increases for both single-stuck and transition patterns. The price for increasing the segments is the ATPG runtime, which will be discussed later.

Similar reduction ratios are achieved for test time. Furthermore, the fact that the cost for additional scan chains is minimal (just a few gates per chain) promises for significant reduction in test time. With only 21 scan input pins, the present invention may support 1,024 scan chains. For Ckt1, that means 29 flip-flops per scan chain. The above parallelization considers parallel loading into the decoder without any shadow registers. Using shadow registers allows for more parallelization.

In order to show how much fault coverage can be achieved while tying multiple segments together, the fault coverage progressive improvement of SSR together with the normal fault coverage achieved with basic ATPG without SSR may be illustrated. FIG. 14 shows the fault coverage vs. the categories and configurations used for Ckt1 with 32 segments (the other segmentations behaved in a similar manner). It is clear that the first category (all segments tied together) achieved more than 99% of the achievable coverage (achievable=97.3, achieved=96.3). In addition, one does not need more than the first two categories to achieve the achievable coverage. Ckt2 exhibits a similar behavior (not shown).

FIG. 15 shows results for the transition fault model instead of the single-stuck model, which are similar to those in FIG. 14. The observations for transition patterns are consistent with those for single-stuck patterns.

The three foregoing described methods for reducing ATPG runtime for SSR have been tried. Only the results from the best performing solution, which is the second method, will be described. With the second method, one does not start with the configuration dd . . . d but rather with cd . . . d or ccd . . . d. This means that one starts with Category 1 or Category 2, etc. The higher the category to start with, the higher the number of care bits in the initial address. This translates into relaxed constraints on the ATPG tool to find matching patterns for the tied segments. On the other hand, since there are fewer segments tied together, the compression ratio may be lower. Thus, selecting which category to be a starting category for SSR is a trade off between runtime and compression ratio.

FIG. 16 shows the reduction in runtime and the increase in stuck-at data volume as a function of the starting category for SSR. FIG. 16 also shows the reference data volume and runtime. The 128 segments configuration of Ckt1 is arbitrarily chosen. As expected, starting with higher categories reduces the runtime and the compression ratio. If starting with Category 0, the compression ratio is 19× and runtime is 4.5 hours. If starting with Category 3, the compression ratio is 9× and the runtime is 25 minutes. Similar fault coverage is achieved by all starting categories and the basic ATPG.

FIG. 17 shows similar data for transition test patterns for the 128 segments configuration of Ckt1. If starting with Category 0, the compression ratio is 22× and the runtime is 60 hours. If starting with Category 3, the compression ratio is 9× and the runtime is 6 hours. Similar fault coverage is achieved by all starting categories and the basic ATPG.

The present invention provides a compression technique which achieves significant test data and test time reduction without requiring any information about the unspecified bits and reduces tester pin requirements while requiring minimal hardware overhead. The present invention also provides a power-optimized version of the technique by which significant improvement in test speed may be achieved. The same systematic reconfiguration algorithm may be applied to different decoder hardware without departing from the scope and spirit of the present invention. As long as the reconfigurability and the high flexibility are achieved without changing the hardware, the algorithm may be applied to any decoding circuitry.

The present invention has the following features. First, the algorithm for SSR is based on the multiple-hot decoder. In addition, the algorithm invokes the ATPG tool with different compatibility configurations between the scan segments until the desired coverage is achieved. Moreover, the algorithm provides very high flexibility in choosing many different configurations. This flexibility may be utilized to reduce test data volume, test application time, test generation time, and/or test power consumption.

The present invention may have the following advantages. First, as shown by the experiments, the algorithm for SSR may reduce the data volume significantly. Moreover, the algorithm may reduce test time by allowing very aggressive segmentation without requiring additional test channels and also by utilizing the ATPG tool to generate compatible patterns to be loaded into the scan segments. In addition, the algorithm may be used to control the power consumption of the circuit by choosing a configuration that activates a certain fraction of the scan segment at a time. Furthermore, the algorithm provides a very high flexibility in terms of the number of configurations possible without any hardware change. Additionally, with the present invention, no changes to the hardware are required with engineering changes. Further, the algorithm does all of the above without requiring any information from the ATPG tool about the unspecified bits in test patterns.

It is to be noted that the foregoing described embodiments according to the present invention may be conveniently implemented using conventional general purpose digital computers programmed according to the teachings of the present specification, as will be apparent to those skilled in the computer art. Appropriate software coding may readily be prepared by skilled programmers based on the teachings of the present disclosure, as will be apparent to those skilled in the software art.

It is to be understood that the present invention may be conveniently implemented in forms of a software package. Such a software package may be a computer program product which employs a computer-readable storage medium including stored computer code which is used to program a computer to perform the disclosed function and process of the present invention. The computer-readable medium may include, but is not limited to, any type of conventional floppy disk, optical disk, CD-ROM, magneto-optical disk, ROM, RAM, EPROM, EEPROM, magnetic or optical card, or any other suitable media for storing electronic instructions.

It is understood that the specific order or hierarchy of steps in the processes disclosed is an example of exemplary approaches. Based upon design preferences, it is understood that the specific order or hierarchy of steps in the processes may be rearranged while remaining within the scope of the present invention. The accompanying method claims present elements of the various steps in a sample order, and are not meant to be limited to the specific order or hierarchy presented.

It is believed that the present invention and many of its attendant advantages will be understood by the foregoing description. It is also believed that it will be apparent that various changes may be made in the form, construction and arrangement of the components thereof without departing from the scope and spirit of the invention or without sacrificing all of its material advantages. The form herein before described being merely an explanatory embodiment thereof, it is the intention of the following claims to encompass and include such changes.

What is claimed is:

1. A method for implementing test application for systematic scan reconfiguration in an integrated circuit, comprising:

defining at least one set of detectable faults;

setting an SAS decoder configuration, the SAS decoder configuration including a don't-care bit;

generating an ATPG pattern;

applying the ATPG pattern to one or more scan chain segments having a segment address associated with the SAS decoder configuration;

including at least one care bit in the SAS decoder configuration; and determining whether the at least one care bit in the SAS decoder configuration is in a least-significant position.

2. The method of claim 1, wherein the applying the ATPG pattern to one or more scan chain segments having a segment address associated with the SAS decoder configuration comprises:

applying the ATPG pattern to a scan chain segment having one or more segment address bits corresponding to the at least one care bit of the SAS decoder configuration.

3. The method of claim 1, wherein the determining whether the at least one care bit in the SAS decoder configuration is in a least-significant position further comprises:

setting an SAS decoder configuration, the SAS decoder configuration including a care bit in a most significant position when the at least one care bit is in the least significant position.

4. The method of claim 1, wherein the including at least one care bit in the SAS decoder configuration comprises:

setting an SAS decoder configuration, the SAS decoder configuration including a care bit in a non-most significant position.

5. The method of claim 1, wherein the determining whether the at least one care bit in the SAS decoder configuration is in a least-significant position further comprises:

shifting at least one care bit from a more significant position to a less significant position when the at least one care bit is in a non-least significant position.

6. The method of claim 1, wherein the including at least one care bit in the SAS decoder configuration comprises:

setting an SAS decoder configuration, the SAS decoder configuration being cc . . . cdd . . . d.

7. The method of claim 1, further comprising:

setting an SAS decoder configuration, the SAS decoder configuration being dd . . . d.

8. The method of claim 1, further comprising:

detecting at least one fault resulting from applying the ATPG pattern to one or more scan chain segments having a segment address associated with the SAS decoder configuration; and removing the at least one fault resulting from applying the ATPG pattern to one or more scan chain segments having a segment address associated with the SAS decoder configuration from the set of detectable faults.

9. A computer-readable medium having computer-executable instructions for performing a method for implementing test generation for systematic scan reconfiguration in an integrated circuit, said method comprising:

defining at least one set of detectable faults;

setting an SAS decoder configuration, the SAS decoder configuration including a don't-care bit;

generating an ATPG pattern;

applying the ATPG pattern to one or more scan chain segments having a segment address associated with the SAS decoder configuration;

including at least one care bit in the SAS decoder configuration; and determining whether the at least one care bit in the SAS decoder configuration is in a least-significant position.

10. The computer-readable medium of claim 9, wherein the applying the ATPG pattern to one or more scan chain segments having a segment address associated with the SAS decoder configuration comprises:

applying the ATPG pattern to a scan chain segment having one or more segment address bits corresponding to the at least one care bit of the SAS decoder configuration.

11. The computer-readable medium of claim 9, wherein the determining whether the at least one care bit in the SAS decoder configuration is in a least-significant position further comprises:

setting an SAS decoder configuration, the SAS decoder configuration including a care bit in a most significant position when the at least one care bit is in the least significant position.

12. The computer-readable medium of claim 9, wherein the including at least one care bit in the SAS decoder configuration comprises:

setting an SAS decoder configuration, the SAS decoder configuration including a care bit in a non-most significant position.

13. The computer-readable medium of claim 9, wherein the determining whether the at least one care bit in the SAS decoder configuration is in a least-significant position further comprises:

shifting at least one care bit from a more significant position to a less significant position when the at least one care bit is in a non-least significant position.

14. The computer-readable medium of claim 9, wherein the including at least one care bit in the SAS decoder configuration comprises:

setting an SAS decoder configuration, the SAS decoder configuration being cc . . . cdd . . . d.

15. The computer-readable medium of claim 9, the method further comprising:

setting an SAS decoder configuration, the SAS decoder configuration being dd . . . d.

16. The computer-readable medium of claim 9, the method further comprising:

detecting at least one fault resulting from applying the ATPG pattern to one or more scan chain segments having a segment address associated with the SAS decoder configuration; and removing the at least one fault resulting from applying the ATPG pattern to one or more scan chain segments having a segment address associated with the SAS decoder configuration from the set of detectable faults.

* * * * *